US008059271B2

(12) United States Patent
Marsh et al.

(10) Patent No.: US 8,059,271 B2
(45) Date of Patent: Nov. 15, 2011

(54) REUSABLE SAMPLE HOLDING DEVICE PERMITTING READY LOADING OF VERY SMALL WET SAMPLES

(75) Inventors: Charles P. Marsh, Urbana, IL (US); Eric Olson, Champaign, IL (US); Todor I. Donchev, Urbana, IL (US); Ivan Petrov, Champaign, IL (US); Jianguo Wen, Champaign, IL (US); Ryan Franks, Arlington, VA (US); Dongxiang Liao, Sunnvyvale, CA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 541 days.

(21) Appl. No.: 12/365,698

(22) Filed: Feb. 4, 2009

(65) Prior Publication Data

US 2010/0193398 A1    Aug. 5, 2010

(51) Int. Cl.
*G01N 1/10* (2006.01)
(52) U.S. Cl. ............... 356/246; 356/244; 250/440.11
(58) Field of Classification Search .......... 250/306–311, 250/428–438, 373, 576, 440.11; 356/244, 356/246, 436, 440, 73; 422/82.05, 82.09; 435/288.5; 73/36, 61, 69, 64, 43, 30
See application file for complete search history.

(56) References Cited

U.S. PATENT DOCUMENTS

| | | | |
|---|---|---|---|
| 4,071,766 A | 1/1978 | Kalman et al. | |
| 4,280,054 A * | 7/1981 | Guarino | 250/440.11 |
| 4,705,949 A | 11/1987 | Grimes et al. | |
| 5,003,174 A * | 3/1991 | Datwyler et al. | 250/343 |
| 5,097,134 A | 3/1992 | Kimoto et al. | |
| 5,362,964 A | 11/1994 | Knowles et al. | |
| 5,406,087 A | 4/1995 | Fujiyoshi et al. | |
| 5,412,211 A | 5/1995 | Knowles | |
| 5,846,842 A * | 12/1998 | Herron et al. | 436/518 |
| 6,989,542 B2 | 1/2006 | Moses et al. | |
| 6,992,300 B2 | 1/2006 | Moses et al. | |
| 7,219,565 B2 | 5/2007 | Fischione et al. | |
| 7,230,242 B2 | 6/2007 | Behar et al. | |
| 7,253,418 B2 | 8/2007 | Moses et al. | |
| 7,304,313 B2 | 12/2007 | Moses et al. | |
| 7,476,871 B2 | 1/2009 | Chao et al. | |
| 7,518,720 B2 * | 4/2009 | Kolp et al. | 356/246 |

(Continued)

OTHER PUBLICATIONS

A. Fukami and K. Fukushima, Environmental Cell: Observation of Wet Specimens; Proc. 8th Europ. Cong. on Elect. Microscopy, Budapest, pp. 71-80, 1984.

(Continued)

*Primary Examiner* — Tarifur Chowdhury
*Assistant Examiner* — Michael P Lapage
(74) *Attorney, Agent, or Firm* — Earl H. Baugher, Jr.

(57) ABSTRACT

A reusable sample-holding device for readily loading very small wet samples for observation of the samples by microscopic equipment, in particular in a vacuum environment. Embodiments may be used with a scanning electron microscope (SEM), a transmission electron microscope (TEM), an X-ray microscope, optical microscope, and the like. For observation of the sample, embodiments provide a thin-membrane window etched in the center of each of two silicon wafers abutting to contain the sample in a small uniform gap formed between the windows. This gap may be adjusted by employing spacers. Alternatively, the thickness of a film established by the fluid in which the sample is incorporated determines the gap without need of a spacer. To optimize resolution each window may have a thickness on the order of 50 nm and the gap may be on the order of 50 nm.

19 Claims, 4 Drawing Sheets

U.S. PATENT DOCUMENTS

2007/0145289 A1* 6/2007 Chao et al. ............... 250/440.11
2011/0079710 A1* 4/2011 Damiano et al. .............. 250/307

OTHER PUBLICATIONS

Fukami, A., et al., Observation Technique for Wet Clay Minerals Using Film-Sealed Environment Cell Equipment Attached to High-Resolution Electron Microscope; in Chapter 36 of Bryant, W.R. et al., (eds), Microstructure of Fine-Grained Sediments from Mud to Shale, pp. 321-331, Springer-Verlag, New York, 1991.

Williamson, M. J. et al., Dynamic Microscopy of Nanoscale Cluster Growth at the Solid-Liquid Interface; Nature Materials, vol. 2, Aug. 2003, Nature Pub. Grp.

* cited by examiner

𝐴

𝐵

REUSABLE SAMPLE HOLDING DEVICE PERMITTING READY LOADING OF VERY SMALL WET SAMPLES

STATEMENT OF GOVERNMENT INTEREST

Under paragraph 1(a) of Executive Order 10096, the conditions under which this invention was made entitle the Government of the United States, as represented by the Secretary of the Army, to an undivided interest therein on any patent granted thereon by the United States. This and related patents are available for licensing to qualified licensees. Please contact Bea Shahin at 217 373-7234.

BACKGROUND

Nanotechnology of materials, related microbiological means of manipulation, and synthetic biology require a means to directly observe nanoscale interactions and classify nano-material morphological properties in solution on a small scale. More specifically the lack of particle and colloid size descriptors and in situ nanoscale imaging techniques are detrimental to advancing the state of the art because it inhibits the ability to verify the reproducibility of nano-fluid preparation necessary for research groups to compare properties.

Using and relying only on more conventional imaging techniques such as a transmission electron microscope (TEM) and a scanning electron microscope (SEM) raises several concerns. TEM and SEM samples are dried and exposed to vacuum before being imaged which changes the observed fundamental properties of the sample. Further, when using a wet cell with a TEM, images should be taken immediately since the energy of the beam quickly de-hydrates the small amount of fluid within the sample. Using conventional techniques, this does not lend itself to accurate particle and agglomerate size characterization much less quantification of other physio-chemical properties.

Besides standard TEM use, the current suite of options available to observe objects at the nanoscale in situ includes the electron cryo-microscope, dynamic light scattering (DLS), small angle x-ray scattering (SAXS), small angle neutron scattering (SANS), and others adapted for more specific applications. The electron cryo-microscope presents drawbacks to drying similar to the TEM and SEM as the sample must be flash frozen into vitreous ice. The procedure distorts the image as well as limiting sample thickness that may be addressed. Moreover, it is undesirable to freeze a sample because the properties of the solution, including species interaction and separation, change. Dynamic light scattering is a very reliable way to determine particle size. DLS works with a broad range of materials in most instances. However, DLS does not work well with non-spherical species such as carbon nanotubes or DNA. Like DLS, small-angle X-ray scattering (SAXS), and small-angle neutron scattering (SANS) are broadly used in research and industry. SAXS has a rather low observable size limit, not able to detect the length of most carbon nanotubes (CNTs), and is best suited for analyzing the surface and bulk properties of larger samples. SANS shares some of the undesirable traits of SAXS and adds the threat of sample damage via neutron-particle interaction. This degrades observation of the extent of colloidal agglomeration, for example.

Existing methods, devices, developments and publications are inherently limited. U.S. Pat. No. 4,071,766, to Kalman et al., employs a film-sealed micro-chamber to hold a wet sample. There are bores or pipes to introduce fluid to this micro-chamber. However, the large chamber or gap height (the length that the electron beam needs to traverse) makes it impractical for use in transmission electron microscopy. For medium high-voltage TEMs, typical sample thickness which is transparent to electron beam is below 700 nm.

Fukami et al. use a design similar to Kalman et al. but with an assembly comprising multiple parts to form the chamber instead of one integral part. A. Fukami and K. Fukushima, Proc. Eighth European Congress on Electron Microscopy, Budapest, pp. 71-80, 1984. A Fukami, K. Fukushima and N. Kohyama, Observation Techniques for Wet Clay Minerals Using Film-Sealed Environmental Cell Equipment Attached to High-Resolution Electron Microscope, In: Microstructure of Fine-Grained Sediments from Mud to Scale, R. H. Bennett, W. R. Bryant, M. H. Hulbert (eds.), New York: Springer-Verlag, pp. 321-331, 1991. Carbon films supported by copper grids are used as the sealing film. Again, the spacing between the films is large. The film is easily broken which can result in extreme damage to microscopy equipment.

U.S. Pat. No. 5,406,087, to Fujiyoshi et al., describes a specimen-holding device that is quite similar to the Fukami et al. design. Two polymer films are pressed together directly by backing copper grids and the samples are trapped between the films. The polymer films and the thin copper grids tend to deform making it impossible to form thin liquid films over relatively large areas. Further, the film is easily broken which can result in extreme damage to microscopy equipment. Moreover, the design does not have any element to control the size of the gap and requires accurate alignment of the grids, which is difficult.

Williamson et al. construct a wet cell by gluing two $Si_3N_4$—coated silicon wafers face to face. M. J. Williamson, R. M. Tromp, P. M. Vereecken, R. Hull, and F. M. Ross, *Dynamic Microsocopy of Nanoscale Cluster Growth at the Solid-Liquid Interface, Nature Materials*, Vol. 2, pp. 532-536, August 2003. Each wafer has a $Si_3N_4$ thin film membrane window formed by selective etching. The wafers are adhered to one another around the edges and a gap between the wafers is created with a deposited $SiO_2$ spacer element. Liquid is loaded into the cell through ports on one wafer. The cell is sealed by gluing sapphire plates over the ports. This invention involves a tedious and time-consuming process involving multiple gluing and curing steps. Further, the glue tends to enlarge the gap. This device does not provide for a sample that is thin enough for observation of desired characteristics.

The following U. S. patents suffer from similar drawbacks as discussed above: U.S. Pat. No. 7,476,871 to Chao et al.; U.S. Pat. No. 7,304,313 to Moses et al.; U.S. Pat. No. 7,253,418 to Moses et al.; U.S. Pat. No. 7,230,242 to Behar et al.; U.S. Pat. No. 7,219,565 to Fischione et al.; U.S. Pat. No. 6,992,300 to Moses et al.; U.S. Pat. No. 6,989,542 to Moses et al.; U.S. Pat. No. 5,412,211 to Knowles; U.S. Pat. No. 5,362,964 to Knowles et al.; U.S. Pat. No. 5,097,134 to Kimoto et al.; and U.S. Pat. No. 4,705,949 to Grimes et al.

A process capable of allowing one to analyze in situ samples of a broad nature mitigates many of the above limitations of conventional methods. Further, it would be advantageous to have a sample holding device with the following characteristics: self-aligning windows on holder pieces and wafers, thus providing for ease of assembling the sample in the holder; a controllable sample volume (gap) thickness via modifying spacer (integral to the wafer or separate) thickness; uniform sample volume thickness; improved spatial resolution resulting from reduced gap (sample volume) thickness; improved resolution resulting from use of ultra-thin (<100 nm) membranes as windows, in particular $Si_3N_4$—coated membranes; durable and reliable sealing of the sample combined with a window pattern that provides reinforcement resulting in safe use in vacuum environments.

A reliable readily implemented in situ imaging technique embodied in select embodiments of the present invention has the above characteristics and allows direct examination of nano-fluid samples without affecting basic characteristics, such as nano-particle dispersion.

DETAILED DESCRIPTION

Figure 1:
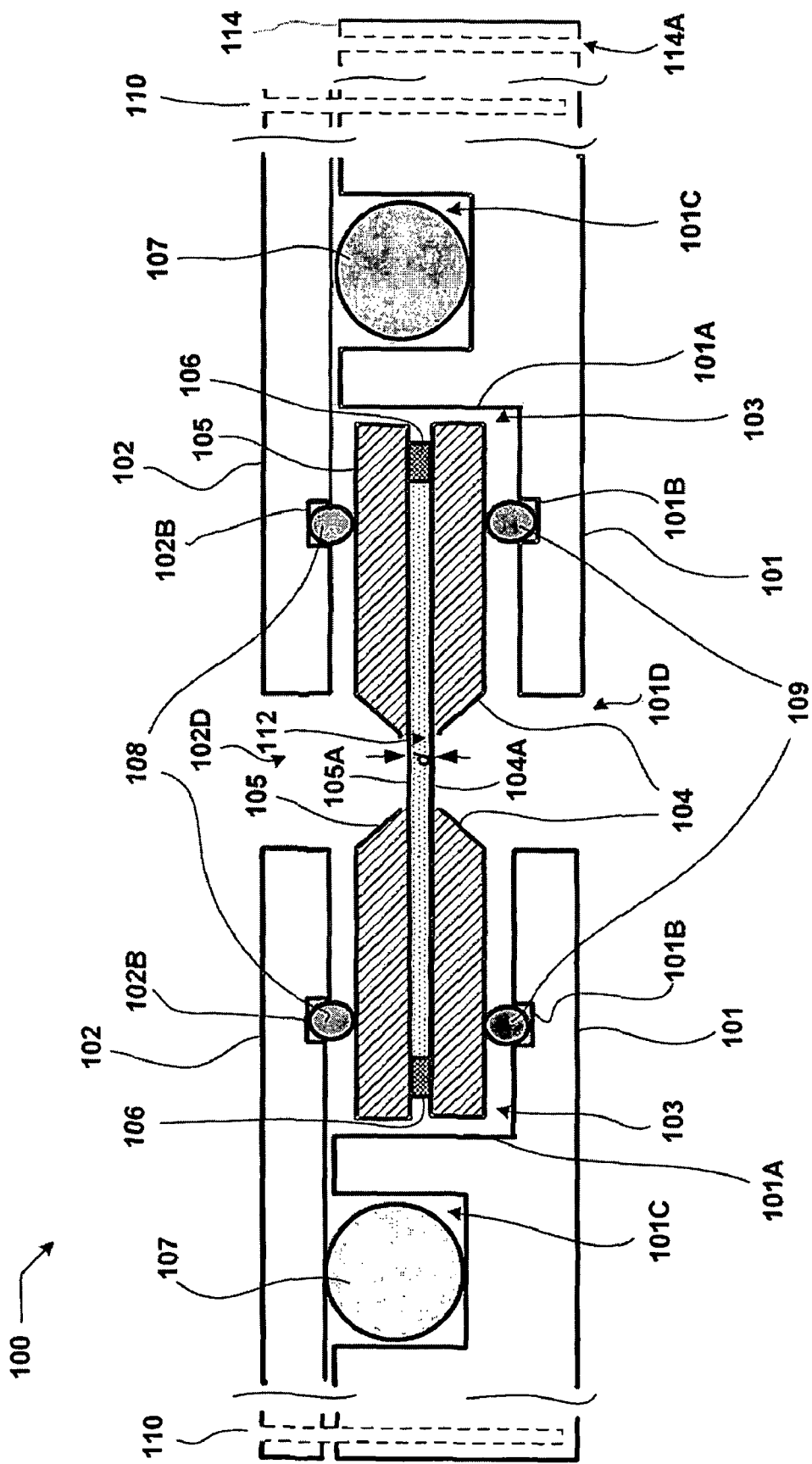
FIG. 1 is an elevation view of a vertical slice through the center of a select embodiment of the present invention.

Select embodiments of the present invention comprise a reusable sample-holding device for readily loading very small wet samples for observation of the samples, in particular in a vacuum environment. Select embodiments of the present invention may be used with an electron microscope, such as a transmission electron microscope (TEM), an x-ray microscope, optical microscope, and the like. Select embodiments of the present invention provide a small volume formed between two silicon wafers for holding the sample via use of a "spacer," such as a washer, for separating the wafers. This volume may be adjustable by employing spacers of different thicknesses. The spacers may be integral with one side of one or both of the silicon wafers or may be separate pieces. Alternatively, the thickness of the film established by the fluid in which the sample exists may determine the volume (gap) without need for use of a spacer.

Each silicon wafer is provided with a transparent thin-film silicon nitride ($Si_3N_4$) membrane that serves as a transparency affixed over an opening (window) in a center section in each silicon wafer. A portion of the center of each wafer is removed, e.g. by etching, to provide for affixing the membrane on one side of the center portion of each wafer, the membrane, e.g. one of $Si_3N_4$ less than about 100 nm thick, preferably about 50 nm thick. Thin membranes assure high resolution although at the expense of being somewhat fragile at a thickness less than 100 nm. In select embodiments of the present invention, high vapor pressure fluid is held in the small volume, typically a uniform gap established between the two silicon wafers by the spacer or spacers. In select embodiments of the present invention, a uniform gap may be maintained by inserting a washer between the silicon wafers and centering the washer on the window (opening) in the center of each wafer.

In select embodiments of the present invention, a sample may be observed through either side of the transparent thin-film membranes incorporated in each of the silicon wafers although the top section of the device may be specifically configured to interface with specialized instruments such as a TEM and thus optimize viewing through a configuration integral with the top of the device. In select embodiments of the present invention, the openings (windows) in similarly shaped silicon wafers are automatically aligned during assembly since the windows are centered in each of the silicon wafers and the wafers are the same shape and length (along their perimeter) as a depression in the lower part of select embodiments of the present invention (i.e., the sample holding device) for retaining the silicon wafers and spacer or spacers.

Select embodiments of the present invention successfully and reliably seal fluid, typically a liquid, between the silicon wafers through use of seals such as O-rings. Further, select embodiments of the present invention are compatible with a high vacuum environment as is found in electron and x-ray microscopy.

Select embodiments of the present invention permit quick and easy studies of samples placed in a fluid. In select embodiments of the present invention, maintaining a consistent gap between two identical "windowed" silicon wafers assures uniform thickness of the sample while providing very thin transparent membranes as the window material ensures high resolution. Select embodiments of the present invention further may be employed with "lab on a chip" designs that incorporate electrodes and fluidic elements for detecting and recording changes that may be imposed on the sample during viewing, such as temperature and pressure changes, electrical and magnetic field changes, and the like.

Select embodiments of the present invention are employed by sandwiching a fluid containing the sample of interest between two silicon wafers incorporating thin-film membrane windows in the center of the side of each wafer abutting the fluid containing the sample. The thin-film membrane preferably comprises $Si_3N_4$. Thin-film membranes are available from Structure Probe, Inc., P.O. Box 656, West Chester, Pa. 19380. Preferably the thin-film membrane "windows" are fabricated by etching the center of a silicon wafer of original thickness about 200 µm to a thickness less than about 100 nm and coating the resultant thinned portion of the etched section with $Si_3N_4$ to create a thin-membrane $Si_3N_4$ window for observing samples immersed in a fluid or wet samples. Preferably this thin-membrane $Si_3N_4$ window is of a thickness about 50 nm.

Select embodiments of the present invention comprise as major components a two-piece configuration of a top and bottom section that abut upon final securing of a sample. The bottom section further comprises an "impression" with an opening in its center that coincides with the openings (windows) of the two silicon wafers separated by one or more spacers to be placed therein. The impression holds and "indexes" the spaced apart wafers so that the center-located windows of the wafers are aligned with each other and the openings in the top and bottom sections. The impression also incorporates a circular slot for each of an inner and outer O-ring. These O-rings are secured upon affixing the top section to the bottom section. The opening (window) in the center of each silicon wafer is covered with a transparent thin-film membrane, e.g., a membrane of $Si_3N4$ that is affixed to the side of the wafer abutting the sample. Preferably the thin-film membranes are of a thickness of less than about 100 nm. The windows are aligned to permit viewing of the sample from either the top or the bottom of the holder device although select embodiments of the present invention embodiments are specifically configured to interface with existing systems for viewing only from the top. In select embodiments of the present invention, various materials, sample holder sizes, and thicknesses may be employed to address specific user requirements. In select embodiments of the present invention, a wafer "sandwich" is placed in a sample holder comprised at least in part of non-magnetic material and incorporates O-rings that create a seal holding a vacuum for the fluid containing the sample placed in the device. Emplacing and securing a wet sample in an embodiment of the present invention takes 10-15 minutes. For select embodiments of the present invention, no alteration to the viewing instrument, such as a microscope or a TEM unit, is necessary.

A method of employing select embodiments of the present invention to allow microscopic observation of a sample comprises: acquiring and sizing the sample to be observed; inserting the sample in a fluid; positioning the top and bottom pieces for the holder device for cleaning; cleaning the top and bottom pieces with a suitable solvent such as isopropyl alcohol; placing a first O-ring in the slot in the bottom piece, placing a first silicon wafer incorporating a first $Si_3N_4$ thin-film membrane in its center in the impression in the bottom piece; placing fluid containing the sample of interest on the center of the first silicon wafer with a pipette or similar device; placing a spacer centered over the center of the first silicon wafer if neither the first or second silicon wafers have an integral spacer or an integral spacer of sufficient depth; placing a second silicon nitride wafer incorporating a second window, the second window abutting the fluid containing the sample in the impression, the second silicon wafer self-aligning in the impression with the first silicon wafer; placing a second inner O-ring in a slot encircling the window in the top piece; placing an outer O-ring in a slot in the top piece, the outer O-ring capable of encircling the entire impression of the bottom piece; placing the top piece with inserted O-rings over the bottom piece, aligning screw heads in the bottom piece with slots in the top piece; rotating the top piece to align it under the screw heads and tightening the screw heads as necessary for retention of the seals made by the O-rings, and emplacing the resultant sample holding device in proximity to the viewing device, indexing the holding device with the viewing device as necessary.

Refer to FIG. 1 depicting a vertical slice longitudinally through a select embodiment of the present invention, specifically detailing the center section of the embodiment. The "body" (frame) of the sample holder 100 comprises two parts, a bottom piece 101 and a top piece 102 configured to affix to the bottom piece 101 upon final assembly of the sample holder 100. The bottom piece 101 is etched completely through its center creating a centered opening 101D and includes an etched rectangular slot 103 centered over the opening 101D. The rectangular slot 103 is configured to contain silicon wafers 104, 105 and "indexes" the wafers 104, 105 in the sample holder 100 via a matching fit of the wafers 104, 105 to the sidewalls 101A of the etched rectangular slot 103. Prior to final assembly of the sample 113 in the sample holder 100, a first O-ring 109 is placed in a circular slot 101B centered within the etched rectangular slot 103. A first silicon wafer 104, etched to configure a thin-membrane $Si_3N_4$—coated window 104A in the center of one side of the silicon wafer 104, is then placed within the rectangular slot 103 with the thin-membrane window 104A facing up. A spacer 106, such as a thin washer, for maintaining a pre-specified gap d, is placed over the bottom piece 104, preferably centered on the opening 101D and the thin-membrane $Si_3N_4$—coated window 104A. Alternatively, the spacer 106 may be incorporated in either or both of the silicon wafers 104, 105 by etching or the like to meet a user's requirements. The sample 112 is placed upon the $Si_3N_4$—coated window 104A and a second silicon wafer 105 configured like the first silicon wafer 104 in size and dimension to include a $Si_3N_4$—coated window 105A centered thereon is placed, with the $Si_3N_4$—coated window 105A abutting the sample 106, upon the spacer 106 in the rectangular slot 103. A second O-ring 107 is placed in a slot 101C circumscribing the rectangular slot 103. A third O-ring 108 with a diameter similar to the first O-ring 109 is placed in a slot 102B in the top piece 102, the top piece 102 incorporating an opening 102D similar to that of the bottom piece 101 and aligned therewith upon final assembly of the sample holder 100. The top piece 102 is affixed to the bottom piece 101 via suitable fasteners inserted in threaded holes 110, compressing all O-rings 107, 108, 109 to form a seal suitable for operation in a vacuum. The sample holder 100 may incorporate a tab 114 incorporating a hole 114A for indexing in observation equipment, such as an SEM or a TEM, or for hanging on a hook in a storage container.

Figure 2:
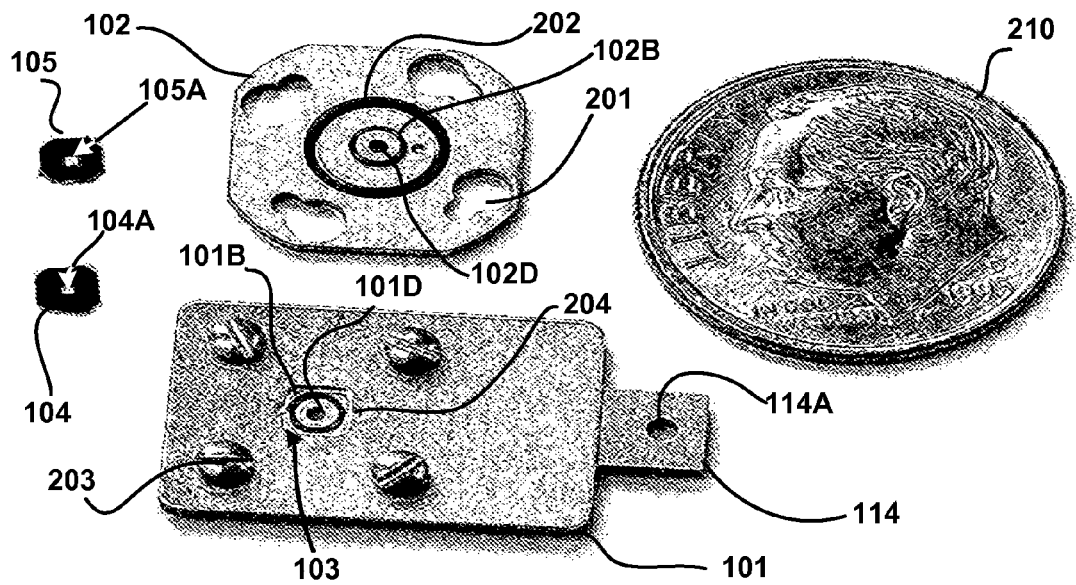
FIG. 2A is a perspective top view of major parts employed in select embodiments of the present invention depicting relative size.
FIG. 2B is FIG. 2A with the silicon wafers installed in the bottom portion of a select embodiment of the present invention, also depicting relative size.
Figure 2:
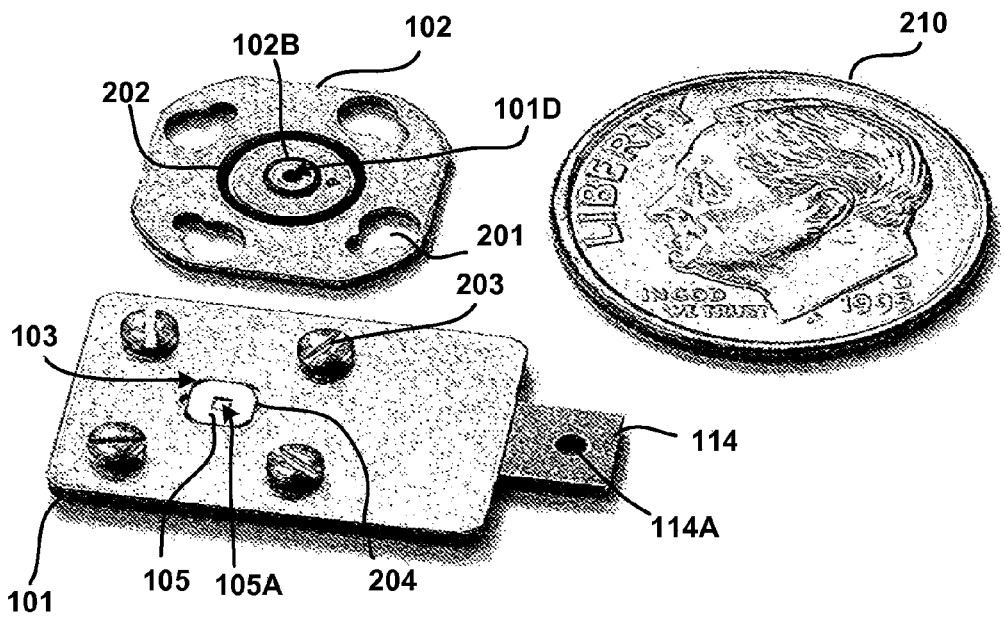

Refer to FIG. 2A, a perspective top view of major parts of an alternative embodiment of the sample holder 100 of FIG. 1, further depicting relative size compared to a dime 210. The top (abutting) side of the bottom piece 101 and the bottom (abutting) side of the top piece 102 is shown, both top and bottom 101, 102 pieces differing from the embodiment of FIG. 1 in that the large O-ring 107 is incorporated in the slot 202 of the top piece 102 in the embodiment of FIG. 2A. The slots 201 in the top piece 102 are configured to permit rotating the top piece 102 once fasteners (machine screws) 203 are loosened. To install the top piece 102, the wide part of the slots 201 is placed over the fasteners 203 and then rotated to the narrow part of the slot 201. The fasteners 203 are then torqued to bring the bottom of the top piece 102 in contact with the top of the bottom piece 102, compressing the O-rings 107, 108, 109 in the process. This slot configuration 201 further facilitates both placement and removal of samples 112 quickly and easily without potential for losing fasteners (machine screws) 203 that otherwise would need to be completely removed to assemble or disassemble the sample holder 100. In FIG. 2A, the silicon wafers 104, 105 are shown separately from the sample holder 100 for perspective. A thumbnail slot 204 is provided in the bottom piece 101 to facilitate removal of the silicon wafers 104, 105 and any spacer(s) 106 upon disassembly of the sample holder 100.

Refer to FIG. 2B, a perspective top view of major parts of an alternative embodiment of the sample holder 100 of FIG. 1, depicting the silicon wafers 104, 105 installed in the bottom piece and further depicting relative size compared to a dime 210.

Figure 3:
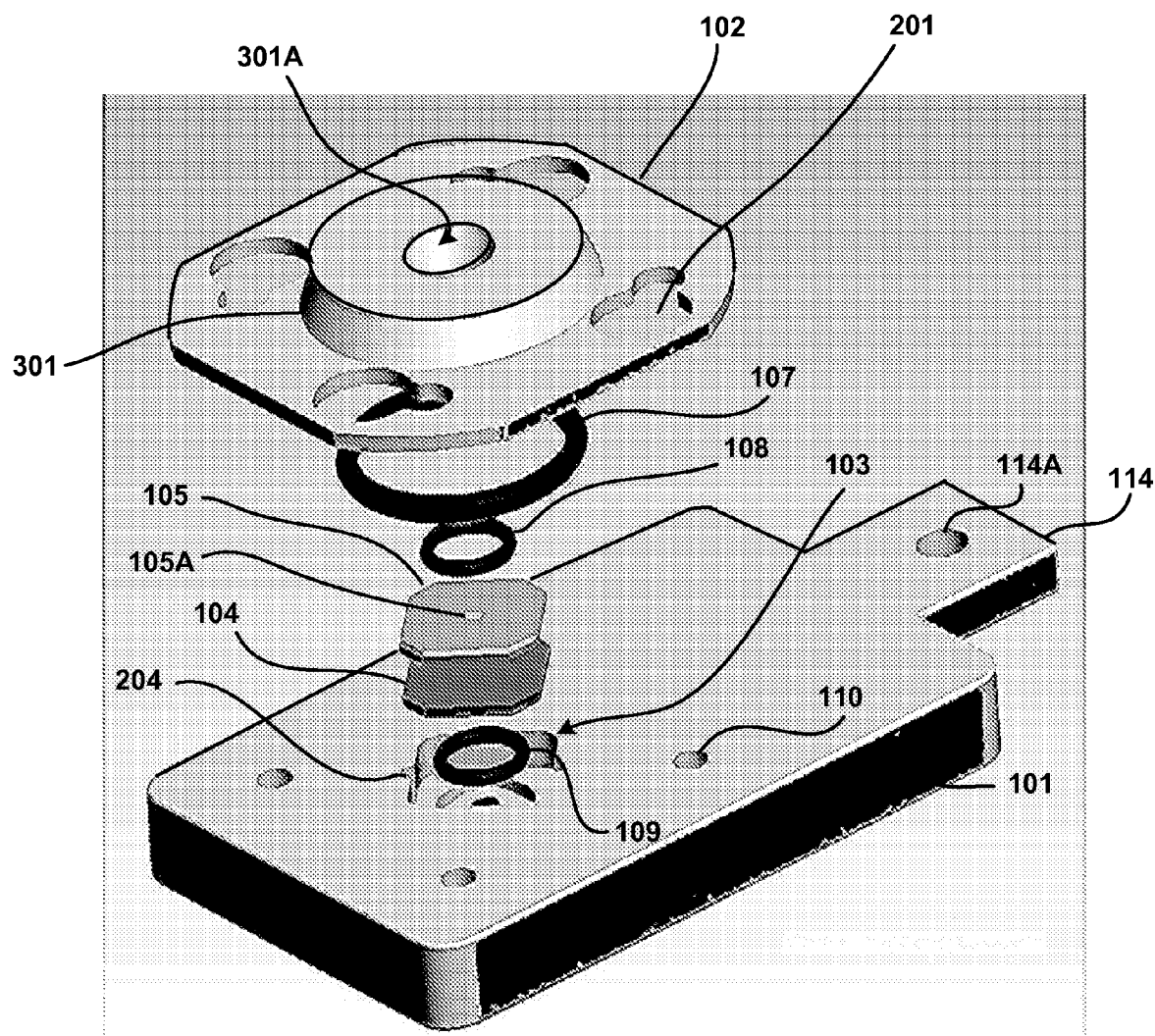
FIG. 3 is a perspective view of major parts of a select embodiment of the present invention in an expanded vertical parts diagram.

Refer to FIG. 3, a perspective view of major parts of a select embodiment of the present invention in an expanded vertical parts diagram. The top side of the top piece 102 is shown with a raised portion 301 with opening 301A to facilitate use with specific types of observation equipment such as a TEM. The large O-ring 107 is shown to fit as in the configuration of FIGS. 2A, 2B and the difference in thickness between the top 102 and bottom piece 101 where abutting is apparent.

Materials employed for various components of select embodiments of the present invention may be pre-specified by a user. For example, non-magnetic materials such as certain aluminum alloys, phosphor or beryllium bronzes and like relatively light materials, are preferred for the top 102 and bottom 101 pieces, the spacer 106 (preferably beryllium if a separate spacer 106 is employed and not an etched portion of the silicon wafers 104, 105), as well as the fasteners 203, with non-magnetic titanium a preferable material for use in at least some of the components.

As to typical sizing of the various elements in select embodiments of the present invention, the depth of the assembled sample holder 100 may be on the order of 3 mm, the silicon wafers 104, 105 may be on the order of 200 µm in overall thickness, the spacer 106 may be on the order of about 50 nm, the thin-membrane $Si_3N_4$—coated windows 104A, 105A on the order of 50 nm or less depending on the strength required, the thin-membrane Si$_3$N$_4$—coated windows 104A, 105A nominally 500 μm on a side for a square thin-membrane Si$_3$N$_4$—coated window 104A, 105A.

Select embodiments of the present invention may be used to observe fluid (liquid, gas, or both) with a TEM, SEM, X-ray microscope or optical microscope. Other applications include incorporating nano-fluidics in the sample holder 100 or electrodes on one or both silicon wafers 104, 105 to study nano-fluidics or electrochemical processes under high-resolution electron microscopes, in particular TEMs. This would permit observing activity of nano-sized species or biological processes in real time.

Figure 4:
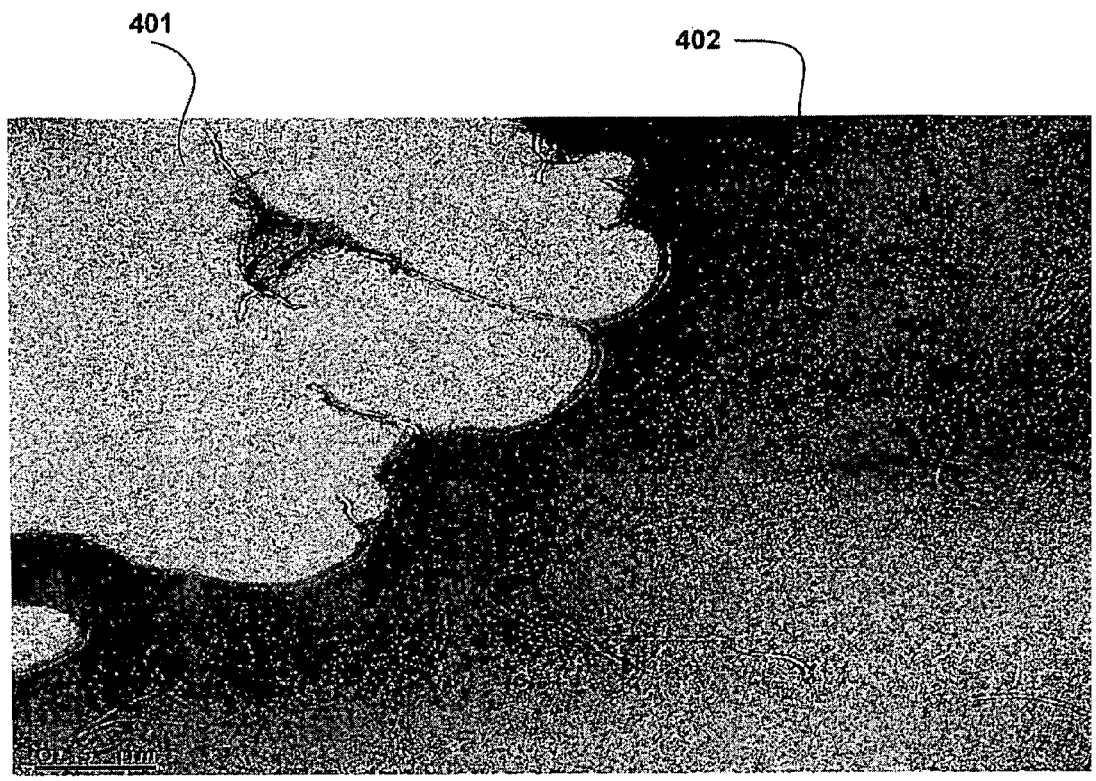
FIG. 4 is a photo of carbon nanotubes (low-Z materials) in water, taken with an embodiment of the present invention.

Refer to FIG. 4, depicting a photo taken with an embodiment of the present invention of carbon nanotubes (low-Z materials) in water. The photo demonstrates that the total thickness of the sample 106 and thin-membrane Si$_3$N$_4$ windows 104A, 105A is sufficient for many applications. Further, these thin-membrane Si$_3$N$_4$ windows 104A, 105A are strong virtually eliminating the possibility of damage to expensive microscopes should they burst under a vacuum. Further, select embodiments of the present invention are relatively inexpensive because everything but the silicon wafers 104, 105 is reusable, and in some conditions, even the wafers 104, 105 may be reusable. Select embodiments of the present invention may be reused many times and are not prone to degradation or structural failure.

For select embodiments of the present invention, the sample holder 100 is easy to assemble, with self alignment mechanisms for the wafers 104, 105 and their centered thin-membrane Si$_3$N$_4$—coated windows 104A, 105A and holder windows 101D, 102D. The gap, d, between the thin-membrane Si$_3$N$_4$—coated windows 104A, 105A is controllable, an extremely important advantage for employment with a TEM. Image quality is a function of total sample thickness, including the two thin-membrane Si$_3$N$_4$—coated windows 104A, 105A and the fluid containing the sample in the gap, d. Select embodiments of the present invention facilitate very thin gap sizes, d, e.g., on the order of 50 nm or less, and inherently yield high resolution.

Refer to FIG. 4, a photo of carbon nanotubes (low-Z materials) 401 in water 402, taken with an embodiment of the present invention. The photo demonstrates that the total thickness of the sample 106 and thin-membrane Si$_3$N$_4$ windows 104A, 105A is sufficient for many applications even at the nano-scale. In select embodiments of the present invention, thin-membrane Si$_3$N$_4$ windows 104A, 105A etched from silicon wafers and coated with Si$_3$N$_4$ are strong, reducing or eliminating the possibility of damage to expensive microscopes from bursting under a vacuum. Further, select embodiments of the present invention are relatively inexpensive because everything but the silicon wafers 104, 105 is reusable, and in some conditions, even the silicon wafers 104, 105 may be reusable. Select embodiments of the present invention may be reused many times and are not prone to degradation or structural failure.

The abstract of the disclosure is provided to comply with the rules requiring an abstract that will allow a searcher to quickly ascertain the subject matter of the technical disclosure of any patent issued from this disclosure. (37 CFR §1.72 (b)). Any advantages and benefits described may not apply to all embodiments of the invention.

While the invention has been described in terms of some of its embodiments, those skilled in the art will recognize that the invention can be practiced with modifications within the spirit and scope of the appended claims. For example, although the system is described in specific examples for holding a small volume wet sample as a very thin film for observation in a vacuum environment such as present with devices such as a TEM, it may be used for any type of testing or monitoring and thus may be useful in such diverse applications as laboratory analysis, structural monitoring, remediating, environmental intervention, industrial processing, and the like. Structure monitored or tested may be of any type ranging from naturally occurring to manmade. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. Thus, it is intended that all matter contained in the foregoing description or shown in the accompanying drawings shall be interpreted as illustrative rather than limiting, and the invention should be defined only in accordance with the following claims and their equivalents.

We claim:

1. A sample holding device, comprising:
a first wafer having a length, width and depth and incorporating a transparent membrane in one side of a said first wafer, said side established by said length and said width of said first wafer;
a second wafer having a length, width and depth and incorporating a transparent membrane in one side of a said second wafer, said side established by said length and said width of said second wafer,
wherein said second wafer is approximately the same size and geometry as said first wafer;
a first component having a length, width and depth, said first component having an opening perpendicular to and through the plane of said first component established by the length and width of said first component, said first component further configured to incorporate both said wafers abutted along their respective length and width so as to be parallel to each other and said plane of said first component, a topmost of said wafers at or below the top of said plane of said first component,
wherein said first component indexes the relative position of said first and second wafers, said wafers abutting to contain said sample in a uniform gap formed between said transparent membranes,
a second component having a length, width and depth, said second component having an opening perpendicular to and through the plane of said second component established by said length and width of said second component, said second component further configured to affix to said first component to secure said sample in said sample holding device;
at least one seal in operable communication with said first and second components; and
at least one fastener for removably affixing said first component to said second component,
wherein said first component further comprises threaded openings in a first pattern about the perimeter of said first component and said second component further comprises fifth slots in a second pattern about the perimeter of said second component, said second pattern movably alignable with said first pattern, said fasteners comprising screws in operable communication with said threaded openings, wherein said second component may be positioned over said first component and rotated to align a narrow portion of each said fifth slot in said second pattern under a matching one of each of said screws in said first pattern, and wherein said screws may be tightened to bring said first component in uniform contact with said second component along respective abutting surfaces of said first and second components, compressing said at least one seal and completing assembly of said sample holding device.

2. The device of claim 1 in which said sample is a wet sample.

3. The device of claim 2 in which said wet sample has a depth of about 50 nm or less.

4. The device of claim 1 in which said wafer is a silicon wafer.

5. The device of claim 4 in which each said silicon wafer is about 200 μm thick,
wherein said transparent membranes are fabricated in said silicon wafer by at least etching said silicon wafer.

6. The device of claim 1 in which said transparent membranes are thin-film $Si_3N_4$-coated membranes.

7. The device of claim 6 in which said thin-film $Si_3N_4$-coated membranes are less than about 100 nm thick.

8. The device of claim 6 in which said thin-film $Si_3N_4$-coated membranes are about 50 nm thick.

9. The device of claim 1 in which only said first component incorporates a first slot for a first one of said at least one seals and said first seal is a first O-ring in operable communication with at least said first and second components,
wherein said first O-ring is captured in at least said first slot.

10. The device of claim 1 in which only said second component incorporates a second slot for a first one of said at least one seals and said first seal is a first O-ring in operable communication with at least said first and second components,
wherein said first O-ring is captured in at least said second slot.

11. The device of claim 1 in which said first component incorporates a third slot for a second one of said at least one seals and said second seal is a second O-ring in operable communication with at least said first wafer and said first component,
wherein said second O-ring is captured in at least said third slot.

12. The device of claim 1 in which said second component incorporates a fourth slot for a third one of said at least one seals and said third seal is a third O-ring in operable communication with at least said second wafer and second component,
wherein said third O-ring is captured in at least said fourth slot.

13. The device of claim 1 in which said screws are machine screws.

14. The device of claim 1 at least said first and second components comprising non-magnetic materials.

15. The device of claim 14 said non-magnetic materials selected from the group consisting of:
aluminum alloys, non-magnetic titanium, beryllium, phosphor bronze, beryllium bronze, non-magnetic metal alloys with a density less than nickel, and combinations thereof.

16. The device of claim 15 in which said at least one interface is integrated in said second component.

17. The device of claim 1 further incorporating at least one interface to a viewing device.

18. The device of claim 17 in which at least one said interface is integrated in said first component.

19. A sample holding device, comprising:
first means having a length, width and depth for incorporating a transparent means in one side said first means, said side established by said length and said width of said first means;
a second means having a length, width and depth and incorporating a transparent means in one side of said second means, said side established by said length and said width of said second means,
wherein said second means is approximately the same size and geometry as said first means;
a first component having a length, width and depth, said first component having an opening perpendicular to and through the plane of said first component established by the length and width of said first component, said first component further configured to incorporate both said first and second means abutted along their respective length and width so as to be parallel to each other and said plane of said first component, a topmost of said first and second means at or below the top of said plane of said first component,
wherein said first component indexes the relative position of said first and second means, said first and second means abutting each other to contain said sample in a uniform gap formed between said transparent means,
a second component having a length, width and depth, said second component having an opening perpendicular to and through the plane of said second component established by said length and width of said second component, said second component further configured to affix to said first component to secure said sample in said sample holding device;
at least one sealing means in operable communication with said first and second components; and
at least one fastening means for removably affixing said first component to said second component,
wherein said first component further comprises threaded openings in a first pattern about the perimeter of said first component and said second component further comprises fifth slots in a second pattern about the perimeter of said second component, said second pattern movably alignable with said first pattern, said fasteners comprising screws in operable communication with said threaded openings, wherein said second component may be positioned over said first component and rotated to align a narrow portion of each said fifth slot in said second pattern under a matching one of each of said screws in said first pattern, and wherein said screws may be tightened to bring said first component in uniform contact with said second component along respective abutting surfaces of said first and second components, compressing said at least one seal and completing assembly of said sample holding device.

* * * * *